United States Patent
Ma

(10) Patent No.: US 9,264,029 B2
(45) Date of Patent: Feb. 16, 2016

(54) CLOCK CYCLE COMPENSATOR AND THE METHOD THEREOF

(71) Applicant: NANYA TECHNOLOGY CORPORATION, Tao-Yuan Hsien (TW)

(72) Inventor: Yan-Tao Ma, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 182 days.

(21) Appl. No.: 13/831,998

(22) Filed: Mar. 15, 2013

(65) Prior Publication Data

US 2014/0266359 A1   Sep. 18, 2014

(51) Int. Cl.
*H03K 3/017* (2006.01)
*H03K 5/156* (2006.01)

(52) U.S. Cl.
CPC .................. *H03K 5/1565* (2013.01)

(58) Field of Classification Search
USPC .......................................................... 327/175
See application file for complete search history.

(56) References Cited

U.S. PATENT DOCUMENTS

2009/0278581 A1* 11/2009 Yang et al. ..................... 327/158
2011/0128059 A1*  6/2011 Kim et al. ...................... 327/175

* cited by examiner

*Primary Examiner* — Lincoln Donovan
*Assistant Examiner* — Patrick Chen
(74) *Attorney, Agent, or Firm* — CKC & Partners Co., Ltd.

(57) ABSTRACT

One aspect of the present invention is to provide a method for compensating a system duty cycle of a system clock signal. The method in one embodiment comprises the following steps: locking a duty cycle center of the system duty cycle by a delay lock loop; detecting a current system duty cycle of the system clock signal; determining a duty cycle correction amount, wherein the duty cycle correction amount is a gap of the current system duty cycle from a target duty cycle; and changing a polarity of an input reference clock signal according to whether the duty cycle correction amount exceed a threshold amount or not.

9 Claims, 4 Drawing Sheets

CLOCK CYCLE COMPENSATOR AND THE METHOD THEREOF

BACKGROUND

1. Field of Invention

The present invention relates to an integrated circuit. More particularly, the present invention relates to a clock cycle compensator and the method thereof.

2. Description of Related Art

Along with the manufacturing process scaling down in recently years, the environmental degradation becomes an issue on integrated circuits. For example, negative bias temperature instability (NBTI) degradation leads to a variation on a threshold voltage of the P-type metal-oxide-semiconductor field-effect transistor (MOSFET), and the variation affects a stability and a performance of an integrated circuit. For example, as the NBTI degradation impacts on a clock generation circuit in a dynamic random access memory (DRAM), a duty cycle of a clock signal generated from the clock generation circuit may be shifted. Further, in certain cases, the NBTI degradation may causes a failure in the DRAM.

Referring to FIG. 1, the effect of the NBTI degradation on a system clock signal is schematically shown. At time of beginning (i.e., timing axis, Time 0), the original effective in-system operational duty cycle range 100, $EISODCR_0$, is denoted as $EISODCR_0=DC_0 \pm DC_R$, where the $DC_0$ is the intrinsic duty cycle center point of the system clock signal and $\pm DC_R$ is range of the duty cycle of the system clock signal. At time x, the time after the NBTI degradation, the corresponding effective in-system operational duty cycle range 120, $EISODCR_X$, is denoted as $EISODCR_X=DC_0 \pm DC_R \pm DCD_X$, where $\pm DCD_X$ is the time shifted by the NBTI degradation. In other words, the NBTI degradation effectively shifts the intrinsic duty cycle by $DCD_X$, which may cause certain potential clocking issues.

Therefore, a heretofore-unaddressed need exists for compensating the NBTI degradation to address the aforementioned deficiencies and inadequacies.

SUMMARY

One aspect of the present invention is to provide a clock cycle compensator for compensating any types of the environmental degradation. The clock cycle compensator comprises an input buffer, an output buffer, a delay lock loop, a duty cycle controlling module, and a bimodal polarity control unit. The input buffer is configured for generating an input reference clock signal. The output buffer is configured for generating a system clock signal. The delay lock loop is electrically connected between the input buffer and the output buffer, and the delay lock loop is configured for locking a duty cycle center of a system clock cycle of the system clock signal. The duty cycle controlling module comprises a duty cycle detection unit and a duty cycle compensation unit. The duty cycle detection unit is configured for detecting a current system duty cycle of the system clock signal. The duty cycle compensation unit is configured for determining a duty cycle correction amount according to a gap between the current system duty cycle and a target duty cycle. Further, the duty cycle compensation unit generates a compensation signal according to whether the duty cycle correction amount exceeds a threshold amount or not. The bimodal polarity control unit is configured for changing a polarity of the input reference clock signal on the input buffer according to the compensation signal.

According to one embodiment of the present invention, the bimodal polarity control unit changes the polarity of the input reference clock signal to a first voltage level when the duty cycle correction amount exceeds the threshold amount and the current system duty cycle is greater than the target duty cycle.

According to another embodiment of the present invention, the bimodal polarity control unit changes the polarity of the input reference clock signal to a second voltage level when the duty cycle correction amount exceeds the threshold amount and the current system duty cycle is smaller than the target duty cycle.

Another aspect of the present invention is to provide a method for compensating a system duty cycle of a system clock signal. The method in one embodiment comprises the following steps: locking a duty cycle center of the system duty cycle by a delay lock loop; detecting a current system duty cycle of the system clock signal; determining a duty cycle correction amount, wherein the duty cycle correction amount is a gap of the current system duty cycle from a target duty cycle; and changing a polarity of an input reference clock signal according to whether the duty cycle correction amount exceed a threshold amount or not.

In the foregoing step of changing a polarity of an input reference clock signal in another embodiment of the present invention comprises the step of changing the polarity of the input reference clock signal to a first voltage level when the duty cycle correction amount exceeds the threshold amount and the current system duty cycle is greater than the target duty cycle.

In the foregoing step of changing a polarity of an input reference clock signal in yet another embodiment of the present invention comprises the step of changing the polarity of the input reference clock signal to a second voltage level when the duty cycle correction amount exceeds the threshold amount and the current system duty cycle is smaller than the target duty cycle.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
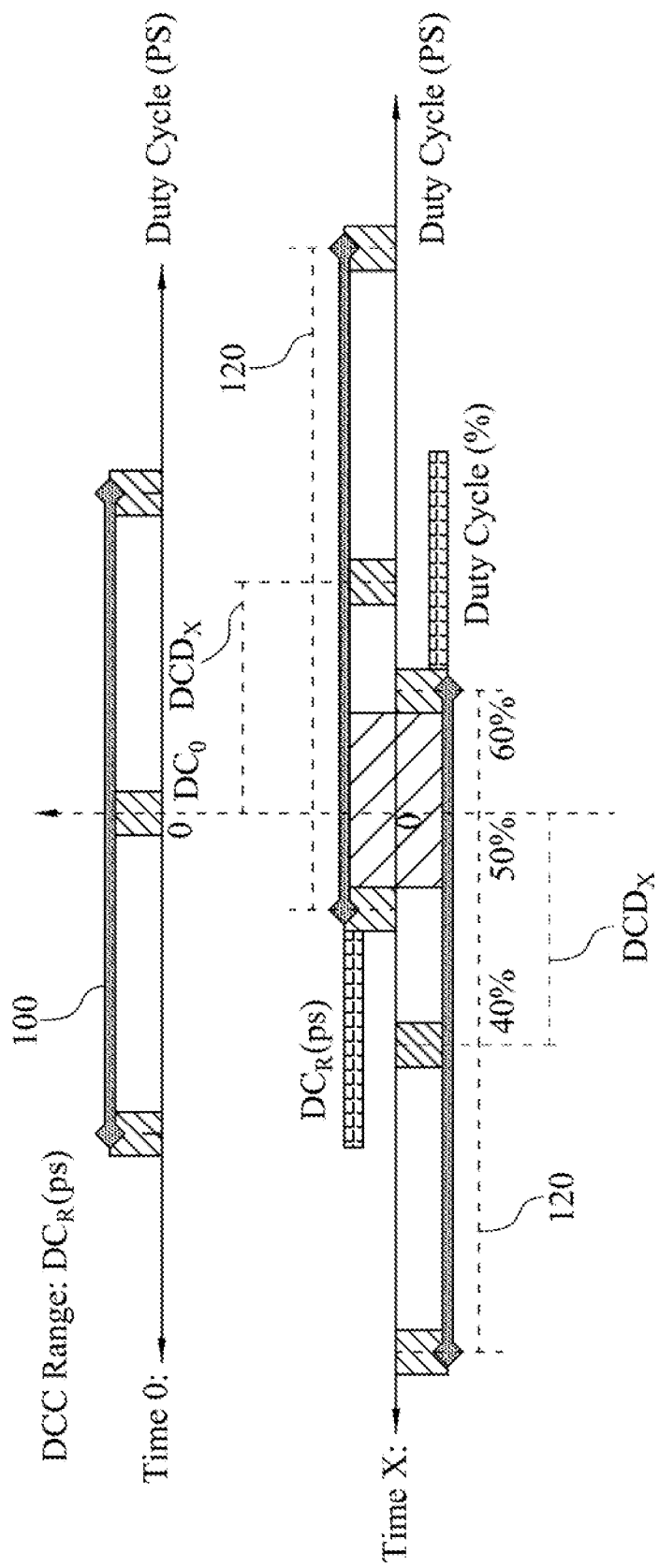
FIG. 1 schematically shows an affect of the NBTI degradation on a system clock signal.

Reference will now be made in detail to the present embodiments of the invention, examples of which are illustrated in the accompanying drawings. Wherever possible, the same reference numbers are used in the drawings and the description to refer to the same or like parts.

Environmental degradation may cause an issue of stability on integrated circuits. For example, negative bias temperature instability (NBTI) degradation, the positive bias temperature Instability (PBTI) degradation, the channel initiated secondary electron (CHISEL) and the gate-induced drain leakages (GIDL) are common environmental degradations, which may affect the parameter of integrated circuits. For demonstration purposes only, the following embodiments are discussed at the case of NBTI degradation.

Figure 2:
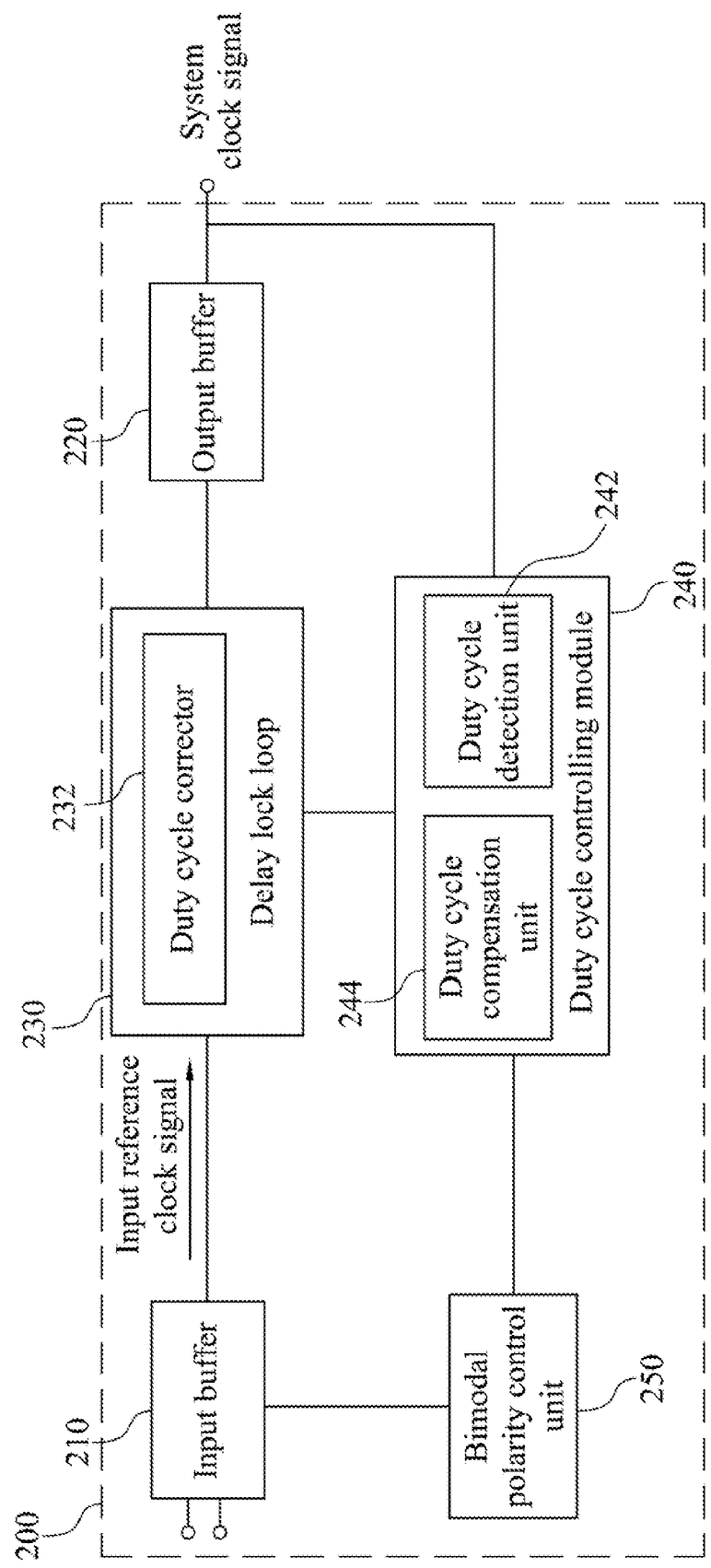
FIG. 2 schematically shows a clock cycle compensator according to one embodiment of the present invention.

Referring to FIG. 2, a clock cycle compensator is schematically shown according to one embodiment of the present invention. The clock cycle compensator 200 includes an input buffer 210, an output buffer 220, a delay lock loop 230, a duty cycle controlling module 240 and a bimodal polarity control unit 250. The input buffer 210 is configured for generating an input reference clock signal, where the input reference clock signal has the bimodal polarity, such as logic "1" and logic "0". The output buffer 220 is configured for generating a system clock signal. The delay lock loop 230 is electrically connected between the input buffer 210 and the output buffer 220, and the delay lock loop 230 is configured for locking a duty cycle center of a system clock cycle of the system clock signal. The duty cycle controlling module 240 is electrically connected to the output buffer 220, and the duty cycle controlling module 240 comprises a duty cycle detection unit 242 and a duty cycle compensation unit 244. The duty cycle detection unit 242 is configured for detecting a current system duty cycle of the system clock signal. The duty cycle compensation unit 244 is configured for determining a duty cycle correction amount according to a gap between the current system duty cycle and a target duty cycle. Then, the duty cycle compensation unit 244 generating a compensation signal according to whether the duty cycle correction amount exceeds a threshold amount or not. For example, it is assumed that the target duty cycle is set as 50%, the threshold amount is set as 5%, and the current system duty cycle detected from the duty cycle detection unit 242 is 60%. According to the current system duty cycle, the duty cycle compensation unit 244 determines the duty cycle correction amount is 10%, and generates a corresponding compensation signal, such as logic "1". In contrast, it is assumed that the current system duty cycle detected from the duty cycle detection unit 242 is 53%. According to the current system duty cycle, the duty cycle compensation unit 244 determines the duty cycle correction amount is 3%, which is smaller than the threshold amount, and generates the corresponding compensation signal, such as logic "0". The bimodal polarity control unit 250 is configured for changing the polarity of the input reference clock signal on the input buffer according to the compensation signal.

In addition, the aforementioned delay lock loop 230 further comprises a duty cycle corrector 232 for correcting a duty cycle error detected from the duty cycle detection unit 242. The duty cycle error, for example, could be the clock signals distorted by the variation of the manufacturing process and so on.

In one embodiment, the bimodal polarity control unit changes the polarity of the input reference clock signal to a first voltage level when the duty cycle correction amount exceeds the threshold amount and the current system duty cycle is greater than the target duty cycle. For example, it is assumed that the target duty cycle is set as 50%, the threshold amount is set as 5%, and the current system duty cycle detect from the duty cycle detection unit is 60%. According to the current system duty cycle, which is greater than the target duty cycle, the duty cycle compensation unit determines the duty cycle correction amount is 10%, which exceeds the threshold amount, and then duty cycle compensation unit generates the corresponding compensation signal logic "1". Further, the first voltage level is set as a high voltage level (i.e. logic "1") to correct the system clock cycle when the circuitry of the system is an even number of chain logic gates. Or, the first voltage level is set as a low voltage level (i.e. logic "0") to correct the system clock cycle when the circuitry of the system is an odd number of chain logic gates.

Figure 3:
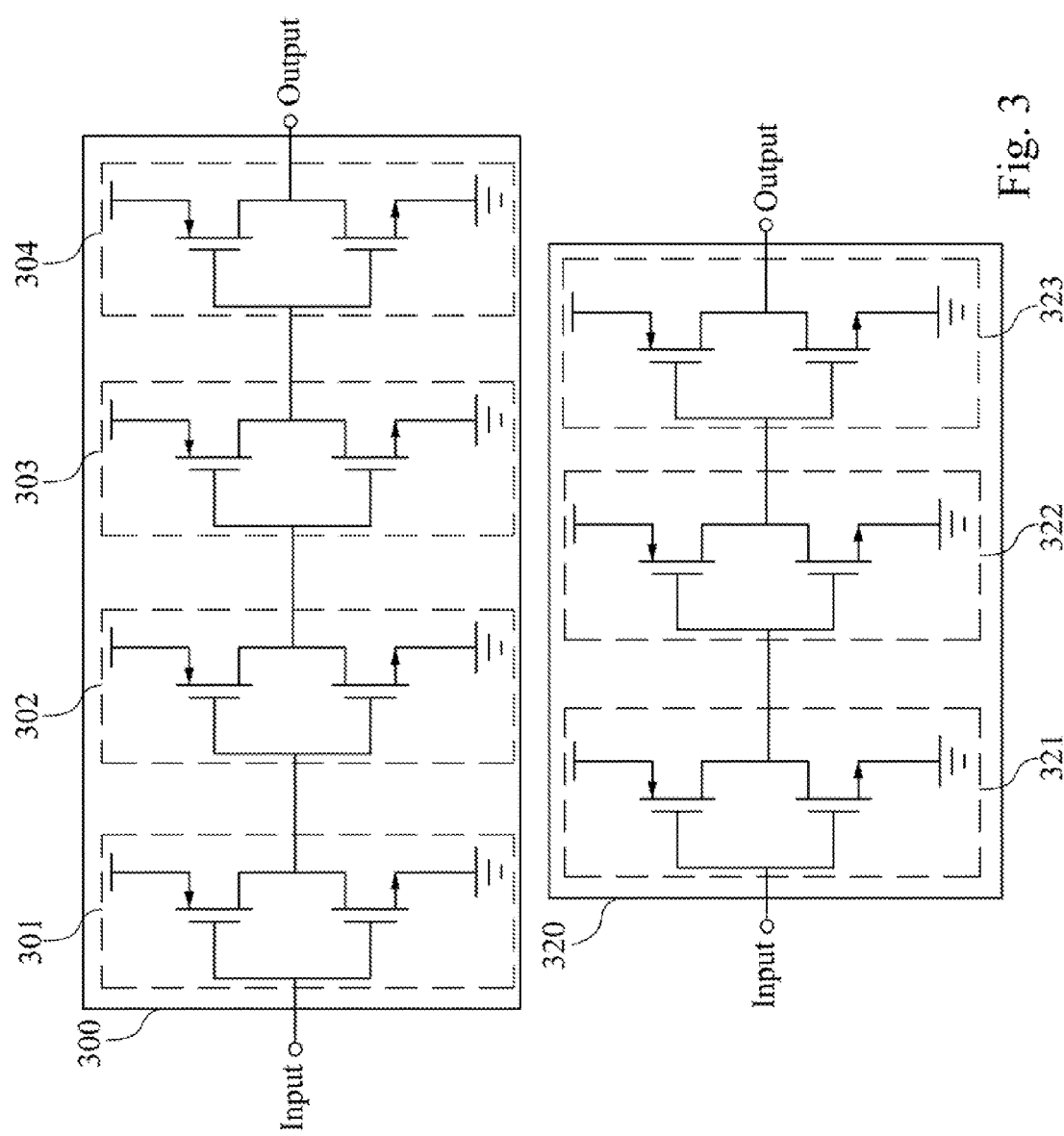
FIG. 3 schematically shows a chain logic gates according to one embodiment of the present invention.

Referring to FIG. 3, a chain logic gates is schematically shown according to the aforementioned example. The even number of the chain logic gates 300 comprises four inverters 301~304 connected in cascade. As previously mentioned, NBTI degradation (or any equivalent degradation) causes a threshold voltage of the P-type MOSFET varied. Input logic "1" to the inverter 301 during the NBTI degradation will cause input to the inverter 302 and the inverter 304 are logic "0", which will cause the threshold voltage of the P-type MOSFET in the inverter 302 and the inverter 304 increasing. So, the pull up ability in the inverter 302 and the inverter 304 are weaker, which leads to output of the even number chain logic gates 300 has longer rising time and the output duty cycle of the even number chain logic gates 300 is reduced. Therefore, in the aforementioned example, the first voltage level is set as a high voltage level to compensate the NBTI degradation when the circuitry of the system is the even number of chain logic gates.

In additional, as shown in FIG. 3, the odd number chain logic gates 320 comprises three inverters 321~323 connected in cascade. Input logic "0" to the inverter 321 during the NBTI degradation will causes input to the inverter 323 is logic "0", which will cause the threshold voltage of the P-type MOSFET in the inverter 323 increasing. So, the pull up ability in the inverter 323 is weaker, which leads to output of the odd number chain logic gates 320 has longer rising time and the output duty cycle of the odd number chain logic gates 320 is reduced. Therefore, in the aforementioned example, the first voltage level is set as a low voltage level to compensate the NBTI degradation when the circuitry of the system is the odd number of chain logic gates.

In another embodiment, the bimodal polarity control unit changes the polarity of the input reference clock signal to a second voltage level when the duty cycle correction amount exceeds the threshold amount and the current system duty cycle is smaller than the target duty cycle. For example, it is assumed that the target duty cycle is set as 50%, the threshold amount is set as 5%, and the current system duty cycle detect from the duty cycle detection unit is 40%. According to the current system duty cycle, which is smaller than the target duty cycle, the duty cycle compensation unit determines the duty cycle correction amount is 10%, which exceeds the threshold amount, and then duty cycle compensation unit generates the corresponding compensation signal logic "0". Further, the second voltage level is set as the low voltage level (i.e. logic "0") to correct the system clock cycle when the circuitry of the system is the even number of chain logic gates. Or, in contrast, the first voltage level is set as the high voltage level (i.e. logic "1") to correct the system clock cycle when the circuitry of the system is the odd number of chain logic gates.

In the same way to illustrate, for example, input logic "0" to the inverter 301 during the NBTI degradation will cause input to the inverter 301 and the inverter 303 are logic "0", which will cause the threshold voltage of the P-type MOSFET in the inverter 301 and the inverter 303 increasing. So, the pull up ability in the inverter 301 and the inverter 303 are weaker, which leads to the output of the even number chain logic gates 300 has longer falling time, thus resulting in the output duty cycle of the even number chain logic gates 300 is reduced. Therefore, in the aforementioned example, the second voltage level is set as the low voltage level to compensate the NBTI degradation when the circuitry of the system is the even number of chain logic gates.

Similarly, input logic "1" to the inverter 321 during the NBTI degradation will causes input to the inverter 322 is logic "0", which will cause the threshold voltage of the P-type MOSFET in the inverter 322 increasing. So, the pull up ability in the inverter 322 is weaker, which leads to output of the odd number chain logic gates 320 has longer falling time, thus resulting in the output duty cycle of the odd number chain logic gates 320 increasing. Therefore, in the aforementioned example, the second voltage level is set as the high voltage level to compensate the NBTI degradation when the circuitry of the system is the odd number of chain logic gates.

In yet another embodiment, the bimodal polarity control unit toggles the polarity of the input reference clock signal when the duty cycle correction amount remains within the threshold amount. For example, the target duty cycle is set as 50%, the threshold amount is set as 5%, and the current system duty cycle detect from the duty cycle detection unit is 53%. According to the current system duty cycle, which is greater than the target duty cycle, the duty cycle compensation unit determines the duty cycle correction amount is 3%, which remains within the threshold amount, and then duty cycle compensation unit generates the corresponding compensation signal. The bimodal polarity control unit toggles the polarity of the input reference clock signal in accordance the corresponding compensation signal for maintaining the current system duty cycle.

Figure 4:
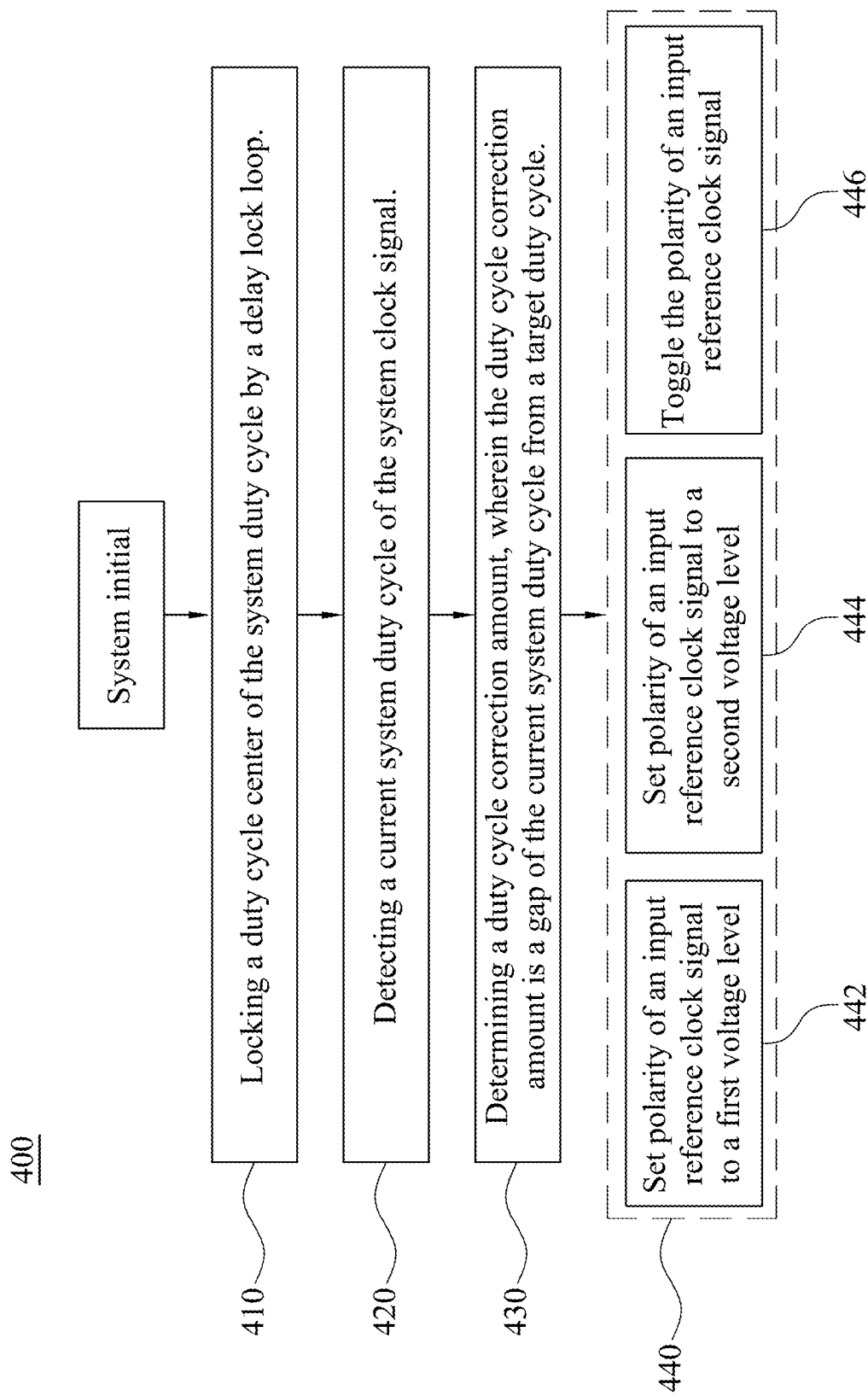
FIG. 4 schematically shows a flow chart of the method shown according to one embodiment of the present invention.

In another aspect of present invention is to provide a method for compensating a system duty cycle of a system clock signal. Referring to FIG. 4, a flow chart of the method is schematically shown according to one embodiment of the present invention.

The method for compensating the system duty cycle of the system clock signal comprises the step of locking a duty cycle center of the system duty cycle by a delay lock loop (step 410). Then, detecting a current system duty cycle of the system clock signal (step 420). Determining a duty cycle correction amount (step 430), wherein the duty cycle correction amount is a gap of the current system duty cycle from a target duty cycle. Further, changing a polarity of an input reference clock signal according to whether the duty cycle correction amount exceed a threshold amount or not (step 440).

Moreover, in the step 440 of changing a polarity of an input reference clock signal, the method 400 further comprises changing the polarity of the input reference clock signal to a first voltage level when the duty cycle correction amount exceeds the threshold amount and the current system duty cycle is greater than the target duty cycle (step 442).

For example, it is assumed that the threshold amount is set as 5%, a target duty cycle is set as 50%, and the current system duty cycle is 60%. The duty cycle correction amount is 10%, which is exceeds the threshold amount. The polarity of an input reference clock signal is changed to logic "1" (i.e. the first voltage level) to compensate the current system duty cycle when the circuitry of the system is the even number of chain logic gates.

As described above, in contrast, the polarity of an input reference clock signal is changed to logic "0" (i.e. the first voltage level) to compensate the current system duty cycle when the circuitry of the system is the odd number of chain logic gates.

Similarly, in the step 440 of changing a polarity of an input reference clock signal, the method 400 further comprises changing the polarity of the input reference clock signal to a second voltage level when the duty cycle correction amount exceeds the threshold amount and the current system duty cycle is smaller than the target duty cycle (step 444).

For example, it is assumed that the threshold amount is set as 5%, a target duty cycle is set as 50%, and the current system duty cycle is 40%, which is smaller than the target duty cycle. The polarity of an input reference clock signal is changed to logic "0 (i.e. the second voltage level) to compensate the current system duty cycle when the circuitry of the system is the even number of chain logic gates.

In addition, in the above example, the polarity of the input reference clock signal is changed to logic "1" (i.e. the second voltage level) to compensate the current system duty cycle when the circuitry of the system is the odd number of chain logic gates.

Further, in the step 440 of changing a polarity of an input reference clock signal, the method 400 further comprises toggling the polarity of the input reference clock signal when the duty cycle correction amount remains within the threshold amount (step 446). For example, the target duty cycle is set as 50%, the threshold amount is set as 5%, and the current system duty cycle detect from the duty cycle detection unit is 53%. The corresponding duty cycle correction amount is 3%, which remains within the threshold amount. Thus, the polarity of the input reference clock signal is toggled in accordance the duty cycle correction amount for maintaining the current system duty cycle.

The above description shows a clock cycle compensator and the method thereof. Although the all said embodiments discussed the case of NBTI degradation, this invention is applicable to any types of environmental degradation which eventually shows the impacts on the clock signal of the system, such as PBTI, CHISEL, GIDL and so on. The clock cycle compensator and the method thereof improve stability and performance in the clock generation circuit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A clock cycle compensator, comprising:
an input buffer for generating an input reference clock signal;
an output buffer for generating a system clock signal;
a delay lock loop electrically connected between the input buffer and the output buffer, wherein the delay lock loop is configured for locking a duty cycle center of a duty cycle range of the system clock signal;
a duty cycle controlling module, comprising:
a duty cycle detection unit for detecting a current system duty cycle of the system clock signal; and
a duty cycle compensation unit for determining a duty cycle correction amount according to a gap between the current system duty cycle and a target duty cycle, the duty cycle compensation unit generating a compensation signal according to whether the duty cycle correction amount exceeds a threshold amount or not; and a bimodal polarity control unit for changing a polarity of the input reference clock signal on the input buffer according to the compensation signal, wherein the bimodal polarity control unit toggles the polarity of the input reference clock signal when the duty cycle correction amount remains within the threshold amount, and the threshold amount is other than 0.

2. The clock cycle compensator of claim 1, wherein the delay lock loop further comprises a duty cycle corrector for correcting a duty cycle error detected from the duty cycle detection unit.

3. The clock cycle compensator of claim 1, wherein the bimodal polarity control unit sets the polarity of the input reference clock signal to a first voltage level, when the duty cycle correction amount exceeds the threshold amount and the current system duty cycle is greater than the target duty cycle.

4. The clock cycle compensator of claim 3, wherein the bimodal polarity control unit sets the polarity of the input reference clock signal to a second voltage level, when the duty cycle correction amount exceeds the threshold amount and the current system duty cycle is smaller than the target duty cycle.

5. The clock cycle compensator of claim 1, wherein the target duty cycle is set as 50% and the threshold amount is set as 5%.

6. A method for compensating a duty cycle range of a system clock signal, the method comprising steps of:

locking a duty cycle center of the duty cycle range by a delay lock loop;

detecting a current system duty cycle of the system clock signal;

determining a duty cycle correction amount, wherein the duty cycle correction amount is a gap of the current system duty cycle from a target duty cycle; and changing a polarity of an input reference clock signal according to whether the duty cycle correction amount exceed a threshold amount or not, wherein changing the polarity of an input reference clock signal comprises:

toggling the polarity of the input reference clock signal when the duty cycle correction amount remains within the threshold amount, and the threshold amount is other than 0.

7. The method of claim 6, wherein in the step of changing a polarity of an input reference clock signal, the method further comprises:

setting the polarity of the input reference clock signal to a first voltage level, when the duty cycle correction amount exceeds the threshold amount and the current system duty cycle is greater than the target duty cycle.

8. The method of claim 7, wherein in the step of changing a polarity of an input reference clock signal, the method further comprises:

setting the polarity of the input reference clock signal to a second voltage level, when the duty cycle correction amount exceeds the threshold amount and the current system duty cycle is smaller than the target duty cycle.

9. The method of claim 6, wherein the target duty cycle is set as 50% and the threshold amount is set as 5%.

* * * * *